(12) United States Patent
Park et al.

(10) Patent No.: US 7,808,103 B2
(45) Date of Patent: Oct. 5, 2010

(54) LEADLESS PACKAGE

(75) Inventors: Sung-min Park, Seoul (KR); Keun-hyuk Lee, Bucheon-si (KR); Seung-Won Lim, Bucheon-si (KR)

(73) Assignee: Fairchild Korea Semiconductor Ltd., Puchon, Kyungki-do (KR)

(*) Notice: Subject to any disclaimer, the term of this patent is extended or adjusted under 35 U.S.C. 154(b) by 0 days.

(21) Appl. No.: 12/349,960

(22) Filed: Jan. 7, 2009

(65) Prior Publication Data

US 2009/0179325 A1    Jul. 16, 2009

(30) Foreign Application Priority Data

Jan. 10, 2008    (KR) .................... 10-2008-0003057

(51) Int. Cl.
*H01L 23/48* (2006.01)
*H01L 23/49* (2006.01)

(52) U.S. Cl. .................. 257/724; 257/729; 257/734; 257/773; 257/784; 257/E23.061; 257/E23.141; 257/E23.169; 228/180.5

(58) Field of Classification Search ............. 257/729, 257/734, 773, 784, E23.017, E23.061, E23.141, 257/E23.169; 228/180.5
See application file for complete search history.

(56) References Cited

U.S. PATENT DOCUMENTS 6,806,580 B2   10/2004   Joshi et al.
7,061,077 B2   6/2006    Joshi
7,154,186 B2   12/2006   Noquil et al.
7,242,076 B2   7/2007    Dolan
7,268,414 B2   9/2007    Choi et al.
7,285,849 B2   10/2007   Cruz et al.
7,315,077 B2   1/2008    Choi et al.
7,335,532 B2   2/2008    Noquil et al.
7,371,616 B2   5/2008    Jereza
7,439,613 B2   10/2008   Joshi et al.
7,468,548 B2   12/2008   Wu et al.
7,504,281 B2   3/2009    Joshi

*Primary Examiner*—Eugene Lee
*Assistant Examiner*—Peniel M Gumedzoe
(74) *Attorney, Agent, or Firm*—Townsend and Townsend and Crew LLP

(57) ABSTRACT

Provided is a semiconductor package, and in particular a semiconductor package which is capable of electrically connecting to the outside without a lead. The leadless package includes a plurality of lower conducting layer patterns disposed separately from one another; an insulating layer pattern on the lower conducting layer patterns; a plurality of upper conducting layer patterns disposed separately from one another, on the insulating layer pattern; at least one semiconductor chip disposed on the upper conducting layer patterns; hole patterns formed through the upper conducting layer patterns and the insulating layer pattern, so that a part of the top surface of the lower conducting layer patterns are exposed; and electrical connectors electrically connecting: the at least one semiconductor chip and the upper conducting layer patterns; the upper conducting layer patterns and the lower conducting layer patterns exposed by the hole patterns; and the at least one semiconductor chip and the lower conducting layer patterns exposed by the hole patterns.

18 Claims, 5 Drawing Sheets

US 7,808,103 B2

LEADLESS PACKAGE

CROSS-REFERENCES TO RELATED APPLICATIONS

This application claims the benefit of Korean Patent Application No. 10-2008-0003057, filed on Jan. 10, 2008, in the Korean Intellectual Property Office, the disclosure of which is incorporated herein in its entirety by reference.

BACKGROUND OF THE INVENTION

1. Field of the Invention

The present invention relates to a semiconductor package, and more particularly, to a semiconductor package which is capable of electrically connecting to the outside without leads.

2. Description of the Related Art

Conventionally, semiconductor packages are formed by a process of loading a single or a plurality of semiconductor chips on a chip pad within a lead frame, protecting the interior by sealing the semiconductor chips with a sealant material, for example, epoxy molding compound (EMC), and then mounting the semiconductor chips on a printed circuit board (PCB). Recently, as electronic devices have increased in speed and capacity, and have become highly integrated, the power devices applied in automobiles, industrial equipment, and household appliances are faced with a requirement of becoming smaller and lighter. Simultaneously, since the electronic devices must achieve low heat emission and high reliability, a module package for a power supply, which has a plurality of semiconductor chips loaded on a single semiconductor package, is becoming more common.

FIG. 1A illustrates a cross-sectional view of a conventional semiconductor package 10. FIGS. 1B and 1C are each a perspective view and a side view, respectively, illustrating a conventional semiconductor package 10 to which leads are attached.

Referring to FIG. 1A, a semiconductor package 10 includes at least one power controlling semiconductor chip 3a indirectly attached to a substrate 1, and a low power semiconductor chip 3b which controls the power-controlling semiconductor chip 3b The wiring pattern 2 is a complex of stacked metal layers, including a copper wiring layer 2a formed on the surface of the substrate 1 and a nickel layer 2b covering the surface of the copper wiring layer 2a.

Although the copper wiring layer 2a provides good electrical conductivity and thus is used as a base layer of the wiring pattern 2, it is easily oxidized even at low temperature, and therefore the surface of the copper wiring layer 2a is covered with a nickel layer 2b, which is an anti-oxidizing film. Since the nickel layer 2b does not have a good coating ability for the copper wiring layer 2a, and since the nickel layer 2b may also be oxidized, a gold layer 2c may be coated once more on the nickel layer 2b. The power controlling semiconductor chip 3a and the low power semiconductor chip 3b are each electrically connected to the wiring pattern 2 through wires 4a and 4b.

The semiconductor chips 3a and 3b are connected to the outside through a lead 5. The lead 5 becomes a channel which connects the semiconductor chips 3a and 3b with the outside of the semiconductor package 10. That is, the semiconductor package 10 has the lead 5 protruding therefrom so as to transmit electrical signals to and from a circuit outside. The lead 5 affects the size of the semiconductor package 10, and when mounted on an external circuit board, a bend may occur in the lead 5.

Referring to FIGS. 1B and 1C, a conventional semiconductor package 10 to which a plurality of leads 5 are attached is illustrated. The conventional semiconductor package 10 is a semiconductor package disclosed in U.S. Design Pat. No. 505,399. When the semiconductor package 10 according to the prior art is mounted on an external circuit board, the distance of insulation d between external leads 5 protruding from the semiconductor package 10 may not be stably maintained.

Therefore, there is a need to implement a semiconductor package which can overcome the lead bending, and can be stably mounted on an external circuit board.

BRIEF SUMMARY

Embodiments of the present invention provide a semiconductor package which overcomes lead bending and can be stably mounted on an external circuit board.

According to an aspect of the present invention, there is provided a leadless package, including a plurality of lower conducting layer patterns disposed separately from one another; an insulating layer pattern on the plurality of lower conducting layer patterns; a plurality of upper conducting layer patterns disposed separately from one another, wherein the plurality of upper conducting layer patters is on the insulating layer pattern; at least one semiconductor chip disposed on the plurality of upper conducting layer patterns; a hole pattern formed in the plurality of upper conducting layer patterns and in the insulating layer pattern, so that a part of the top surface of the plurality of lower conducting layer patterns is exposed; a first electrical connector electrically connecting the at least one semiconductor chip and the plurality of upper conducting layer patterns; a second electrical connector electrically connecting the plurality of upper conducting layer patterns and the part of the top surface of the lower conducting layer patterns exposed by the hole pattern; and a third electrical connector electrically connecting the part of the top surface of the lower conducting layer patterns exposed by the hole pattern with the at least one semiconductor chip.

The leadless package may further include a sealant material for sealing the at least one semiconductor chip, the electrical connectors, the hole patterns, the upper conducting layer patterns, the insulating layer, and the lower conducting layer patterns, so that only portions of the bottom surface of the lower conducting layer patterns are exposed to the outside.

Here, the upper conducting layer patterns may be formed of a first conductive material including a metal or an alloy, and preferably copper. In addition, the lower conducting layer patterns may be formed of a second conductive material including a metal or an alloy, and preferably aluminum.

Furthermore, the electrical connectors may include bonding wires, ribbon wires, or metal clips. The bonding wires, ribbon wires, or metal clips may be formed of aluminum, copper, or gold.

Moreover, the plurality of semiconductor chips may include an insulating gate bipolar transistor (IGBT) or a diode. Meanwhile, the sealant material may be formed of epoxy molding compound (EMC).

According to another aspect of the present invention, there is provided a leadless package including: an insulating layer pattern having a hole pattern; at least one semiconductor chip disposed on a top surface of the insulating layer pattern; a plurality of lower conducting layer patterns disposed separately from one another, on the bottom surface of the insulating layer pattern, wherein a part of the top surface of one or more of the plurality of lower conducting layer patterns is exposed by the hole pattern; and at least one electrical connector electrically connecting the top surface of the lower conducting layer patterns exposed by the hole pattern and the at least one semiconductor chip.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
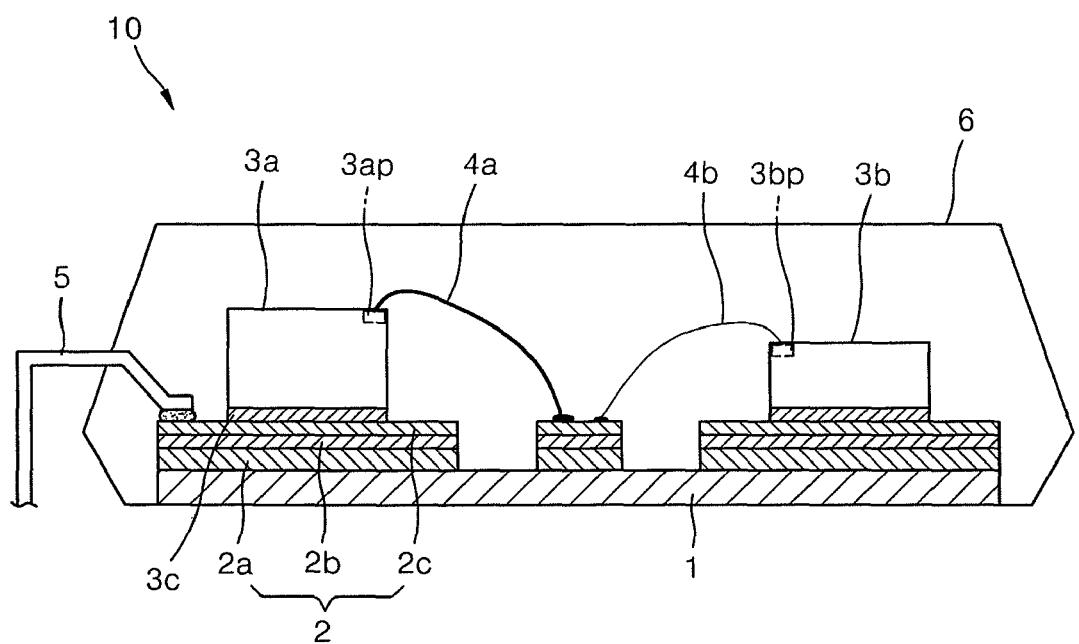
FIG. 1A illustrates a cross-sectional view of a conventional semiconductor package.
Figure 1B:
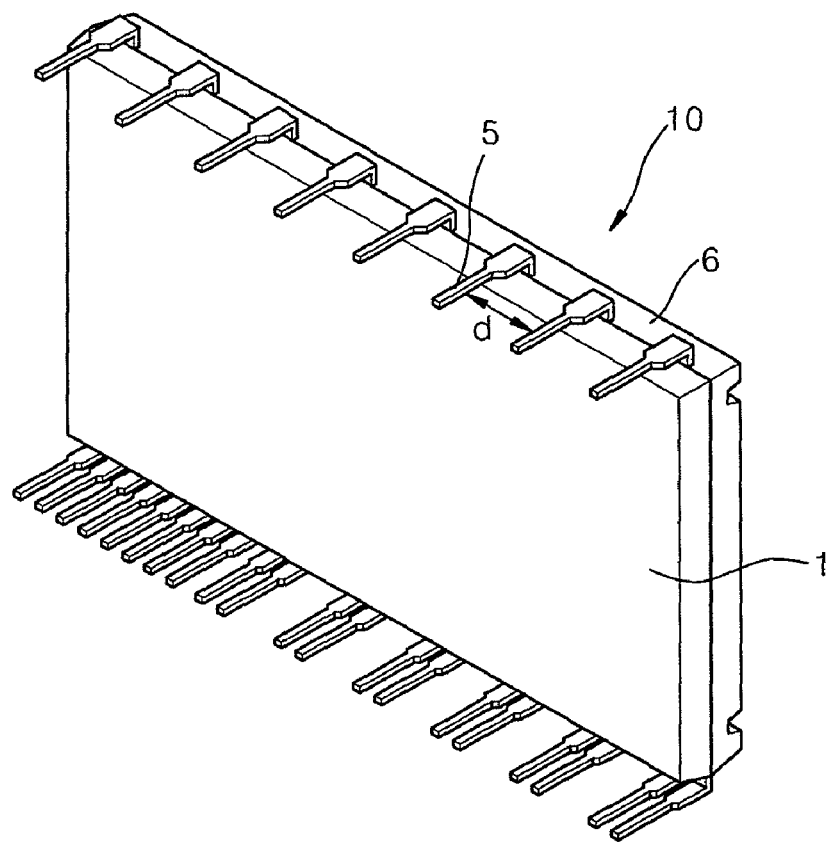
FIGS. 1B is a perspective view illustrating a conventional semiconductor package to which leads are attached.
Figure 1C:
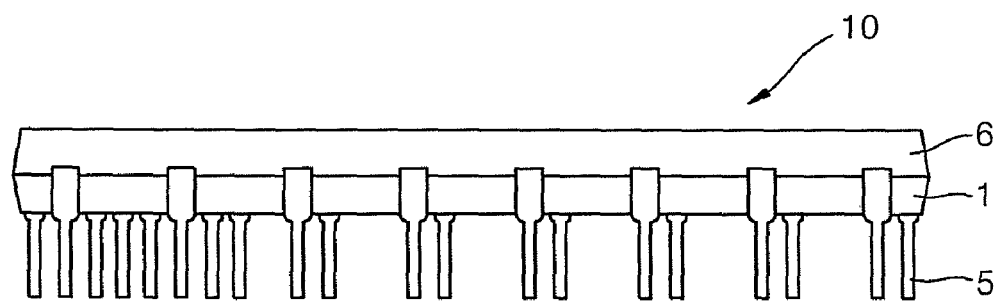
FIGS. 1C is a side view, illustrating a conventional semiconductor package to which leads are attached.

Hereinafter, the present invention will be described more fully with reference to the accompanying drawings, in which preferred embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art. In the drawings, the thicknesses of layers and regions are exaggerated for clarity.

Like reference numerals in the drawings denote like elements. It will also be understood that, across the entire specification, when a layer is referred to as being "on" or "disposed on" another layer or substrate, it can be directly on the other layer or substrate, or intervening layers may also be present unless otherwise indicated.

Figure 2:
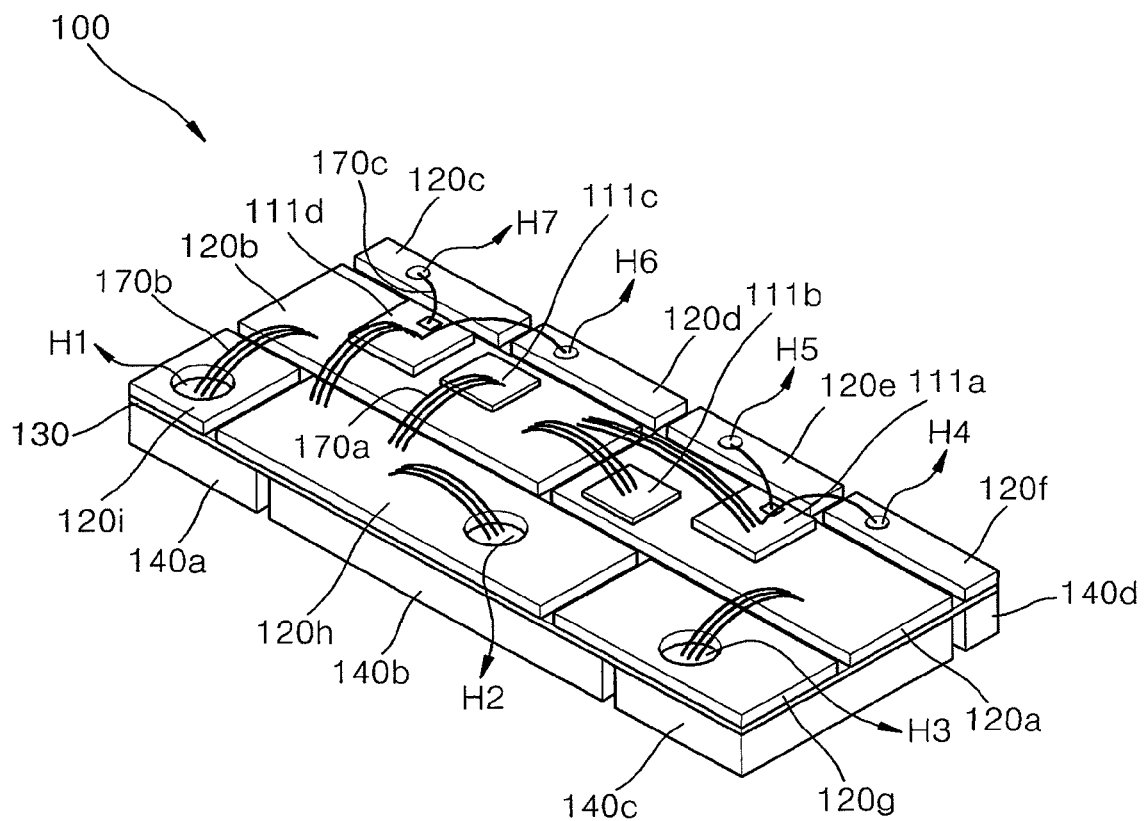
FIG. 2 is a perspective view illustrating a leadless package according to an embodiment of the present invention.

FIG. 2 is a perspective view illustrating a leadless package according to an embodiment of the present invention. Referring to FIG. 2, the leadless package 100 includes a plurality of lower conducting layer patterns that are physically separated from one another. In FIG. 2, the top surface of the leadless package is shown, and only lower conducting layer patterns 140a to 140d are a visible, which comprise a portion of the plurality of lower conducting layer patterns. In FIG. 3C, the bottom surface of the leadless package 100 is shown, and all of the plurality of lower conducting layer patterns 140a to 140h according to an embodiment of the invention are shown.

An embodiment of the present invention provides an example of a total of 8 lower conducting layer patterns 140a to 140h disposed separately from one another, but the present invention is not limited by the number of lower conducting layer patterns, and embodiments of the invention contemplate more or less than 8 lower conducting layer patterns. The plurality of lower conducting layer patterns may preferably be formed of a conductive material including a metal or an alloy, for example, aluminum or copper.

For convenience of explanation the plurality of lower conducting layer patterns 140a to 140h may be respectively labeled as: a first lower conducting layer pattern 140a, a second lower conducting layer pattern 140b, a third lower conducting layer pattern 140c, a fourth lower conducting layer pattern 140d, a fifth lower conducting layer pattern 140e, a sixth lower conducting layer pattern 140f, a seventh lower conducting layer pattern 140g, and an eighth lower conducting layer pattern 140h. In certain embodiments of the invention, the plurality of lower conducting layer patterns 140a to 140h are disposed separately from one another, meaning that each of the layers, from the first lower conducting layer pattern 140a to the eighth lower conducting layer pattern 140h, are electrically separated from each other (i.e., not in direct contact with each other). In certain embodiments of the invention, the layers are electrically separated from each by means of being spaced apart. In other embodiments, the layers can have an insulating material (such as a sealant material) disposed between each of them.

An insulating layer pattern 130 is disposed on the plurality of lower conducting layer patterns 140a to 140h. The insulating layer pattern 130 may preferably be formed on and across the entire surface of the plurality of lower conducting layer patterns 140a to 140h. However, a part of the insulating layer pattern 130 can be removed by hole patterns H1 to H7 which will be described later, thus exposing the top surface of the lower conducting layer pattern corresponding to the hole pattern.

A plurality of upper conducting layer patterns are disposed on the insulating layer pattern 130. Each of the upper conducting layer patterns in the plurality of upper conducting layer patterns are electrically separated from one another. In certain embodiments of the invention, the layers are electrically separated from each by means of being spaced apart. In other embodiments, the layers can have an insulating material (such as sealant) disposed between each of them. An embodiment of the present invention provides an example of a total of 9 upper conducting layer patterns 120a to 120i disposed separately from one another, but the present invention is not limited by the number of the upper conducting layer patterns 120a to 120i. Moreover, the number of upper conducting layer patterns may not necessarily be the same as the number of lower conducting layer patterns. The plurality of upper conducting layer patterns 120a to 120i may preferably be formed of a conductive material including a metal or an alloy, for example aluminum or copper.

For convenience of explanation, the plurality of upper conducting layer patterns 120a to 120i may be respectively labeled as: a first upper conducting layer pattern 120a, a second upper conducting layer pattern 120b, a third upper conducting layer pattern 120c, a fourth upper conducting layer pattern 120d, a fifth upper conducting layer pattern 120e, a sixth upper conducting layer pattern 120f, a seventh upper conducting layer pattern 120g, an eighth upper conducting layer pattern 120h, and ninth upper conducting layer pattern 120i. The plurality of upper conducting layer patterns 120a to 120i are disposed separately from one another, meaning that each of the first upper conducting layer pattern 120a to the ninth upper conducting layer pattern 120i are not being in direct contact with one another, but are disposed to be electrically separated from each other as described above.

At least one semiconductor chip from among the plurality of semiconductor chips 111a to 111d may be disposed on the plurality of upper conducting layer patterns 120a to 120i. The plurality of semiconductor chips 111a to 111d may include a power controlling semiconductor chip and/or a low power semiconductor chip driving a power controlling semiconductor chip. Each semiconductor chip in the plurality of semiconductor chips 111a to 111d may include an insulated gate bipolar transistor (IGBT) and/or a diode 111b. An IGBT has the advantages of both the fast switching characteristics of Morse-type devices, and the high current density of bipolar-type devices, and is often used as a switching device.

An embodiment of the present invention provides an example of having at least one semiconductor chip from among the plurality of semiconductor chips 111a to 111d, respectively disposed on each of the first upper conducting layer pattern 120a and the second upper conducting layer pattern 120b, but the scope of the present invention is not limited thereto.

A plurality of hole patterns H1 to H7 is formed through the insulating layer pattern 130 and the plurality of upper conducting layer patterns 120a to 120i, in such a manner that a part of the top surface of the lower conducting layer patterns is exposed. The plurality of hole patterns H1 to H7 may be formed by any suitable method, including etching.

According to an embodiment of the present invention, the first hole pattern H1 is formed by etching a part of the ninth upper conducting layer pattern 120i and the insulating layer pattern 130 so as to expose the top surface of the first lower conducting layer pattern 140a; the second hole pattern H2 is formed by etching a part of the eighth upper conducting layer pattern 120h and the insulating layer pattern 130 so as to expose the top surface of the second lower conducting layer pattern 140b; the third hole pattern H3 is formed by etching a part of the seventh upper conducting layer pattern 120g and the insulating layer pattern 130 so as to expose the top surface of the third lower conducting layer pattern 140c.

Moreover, the fourth hole pattern H4 is formed by etching a part of the sixth upper conducting layer pattern 120f and the insulating layer pattern 130 so as to expose the top surface of the fourth lower conducting layer pattern 140; the fifth hole pattern H5 is formed by etching a part of the fifth upper conducting layer pattern 120e and the insulating layer pattern 130 so as to expose the top surface of the fifth lower conducting layer pattern 140e; the sixth hole pattern H6 is formed by etching a part of the fourth upper conducting layer pattern 120d and the insulating layer pattern 130 so as to expose the top surface of the sixth lower conducting layer pattern 140f; the seventh hole pattern H7 is formed by etching a part of the third upper conducting layer pattern 120c and the insulating layer pattern 130 so as to expose the top surface of the seventh lower conducting layer pattern 140g. However, such positions of the plurality of hole patterns H1 to H7 are only provided as an example, and should not limit the scope of the present invention. Embodiments of the present invention contemplate other amounts and positions of hole patterns.

A plurality of electrical connectors 170a, 17b, and 170c are provided to transmit electrical signals between at least one semiconductor chip from among the plurality of semiconductor chips 111a to 111d, and an external circuit board that the package may be mounted on. The plurality of electrical connectors 170a to 170c may preferably be bonding wires. However, the present invention is not limited to such a configuration, and the plurality of electrical connectors 170a to 170c may include ribbon wires and/or metal clips. The bonding wires, ribbon wires, and/or metal clips may preferably be inclusively formed of aluminum, copper, or gold.

FIG. 2 shows a wiring scheme according to an embodiment of the present invention. In this embodiment, a first bonding wire 170a electrically connects at least one semiconductor chip 111c (taken from among the plurality of semiconductor chips 111a to 111d) with the upper conducting layer pattern 120h (taken from among the plurality of upper conducting layer patterns 120a to 120i). A second bonding wire 170b electrically connects the upper conducting layer pattern 120b (taken from among the plurality of upper conducting layer patterns 120a to 120i) with the lower conducting layer pattern 140a (taken from among the plurality of lower conducting layer patterns 140a to 140h) that is exposed by the hole pattern H1. Furthermore, third bonding wire 170c electrically connects at least one semiconductor chip 111d (taken from among the semiconductor chips 111a to 111d) with a lower conducing layer pattern taken from among the plurality of lower conducting layer patterns 140a to 140h that is exposed by the hole patterns H7. Other suitable wiring schemes are contemplated by embodiments of the invention.

Figure 3A:
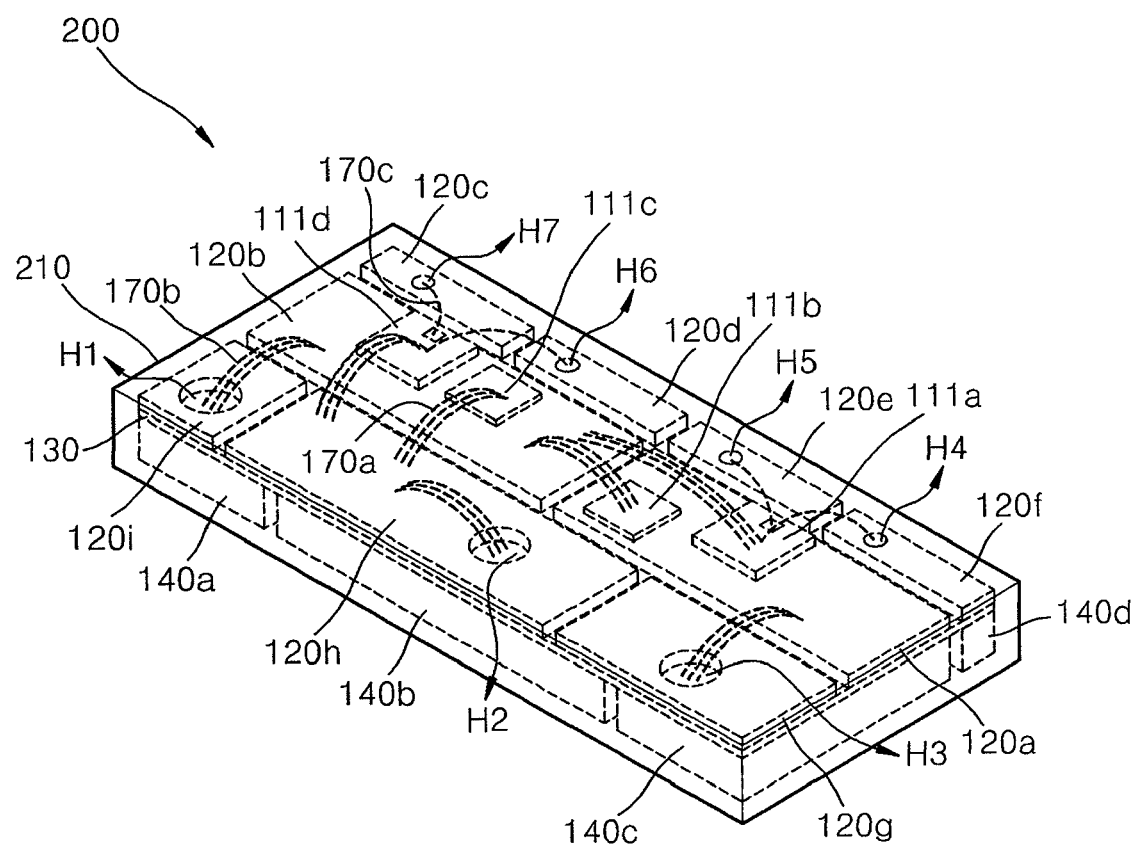
FIG. 3A is a perspective view illustrating a projected structure of a leadless package described according to FIG. 2 disposed within a sealant material.
Figure 3B:
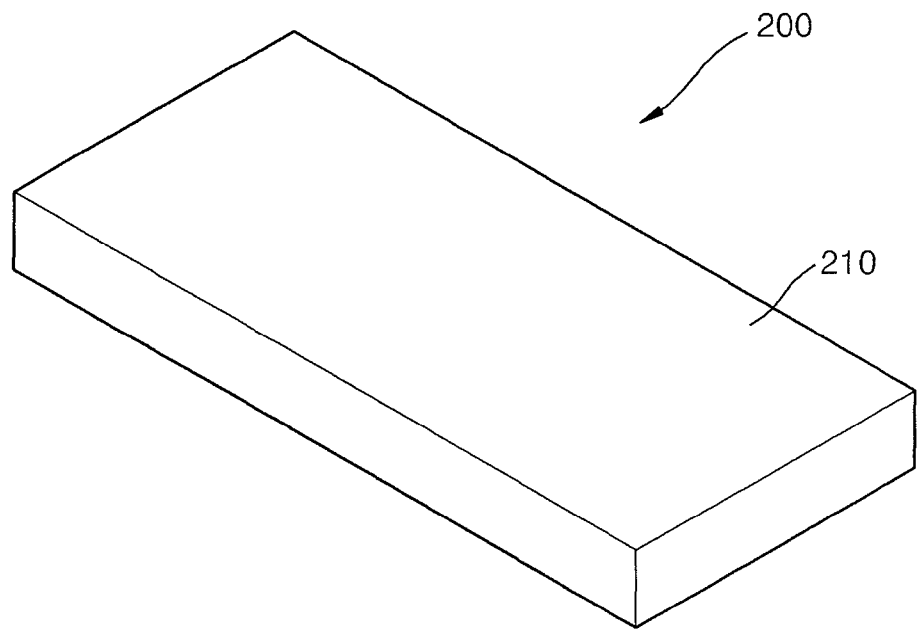
FIG. 3B is a perspective view of a leadless package shown from above.
Figure 3C:
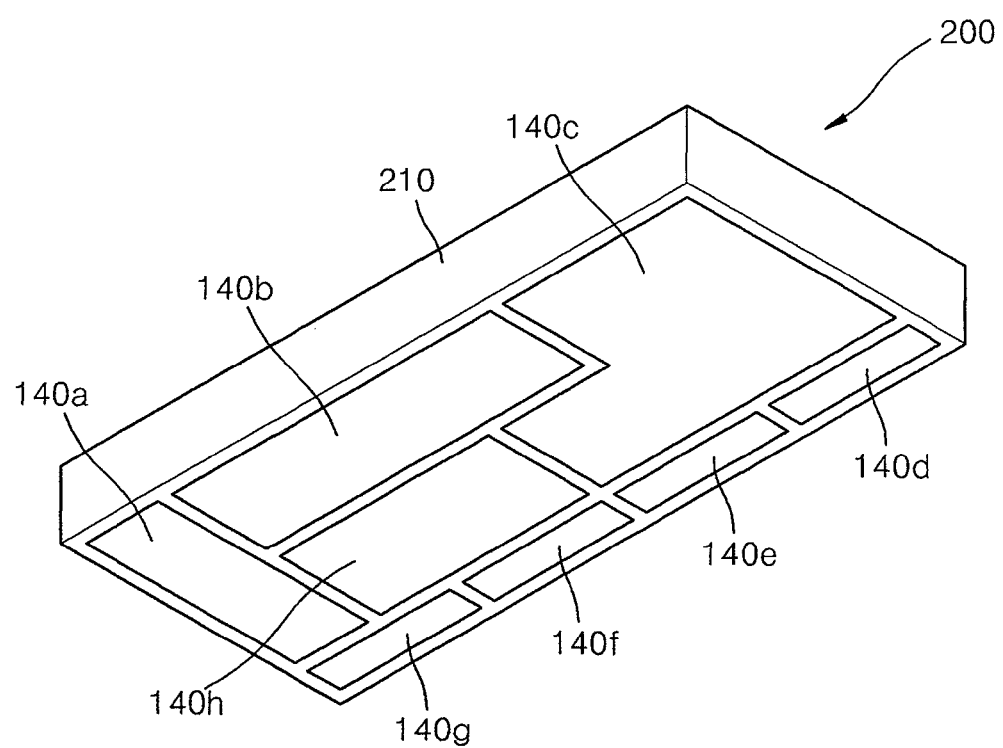
FIG. 3C is a perspective view of a leadless package shown from below.

FIGS. 3A to 3C are perspective views of a leadless package 200 according to an embodiment of the present invention.

FIG. 3A is a perspective view of a molded leadless package, wherein the inside structure is shown visible within a sealant material 210. FIG. 3B is a perspective view of the leadless package 200 shown from above, and FIG. 3C is a perspective view of the leadless package 200 shown from below.

Referring to FIGS. 3A to 3C, a sealant material 210 for sealing the structure 100 described in FIG. 2 is disclosed. That is, a sealant material 210 is disclosed, which seals and protects the plurality of semiconductor chips 111a to 111d, plurality of electrical connectors 170a to 170c, plurality of hole patterns H1 to H7, upper conducting layer patterns 120a to 120i, and plurality of lower conducting layer patterns 140a and 140h, etc. The bottom surfaces of the plurality of lower conducting layer patterns 140a to 140h are exposed to the outside by the sealant material 210. The sealant material 210 may preferably be formed of suitable materials such as epoxy molding compound (EMC).

The bottom surface of the molded leadless package 200 (containing the plurality of lower conducting layer patterns 140a to 140h) may be electrically connected to an external circuit board. This can be done through solder or other suitable means. Thus, the plurality of lower conducting layer patterns 140a to 140h may be electrically coupled to the external circuit board. In addition, spaces between each of the lower conducting layer patterns in the plurality of lower conducting layer patterns 140a to 140h are filled with a sealant material 210, which can act as an electrical insulator. When the plurality of lower conducting layer patterns 140a to 140h are coupled with an external circuit board, the sealant material maintain a stable (i.e. relatively constant at all points of the underside of the package) distance of insulation, between the package 200 and the external circuit board.

The geometric forms and arrangements of the upper conducting layer patterns 120a to 120i, the plurality of lower conducting layer patterns 140a to 140h, and the plurality of hole patterns H1 to H7, are provided as an example, and can be modified freely according to the needs of the user, based on the technical concept of the present invention.

Certain embodiments of the leadless package include the upper conducting layer patterns 120a to 120i. In an alternative embodiment of the present invention, the plurality of semiconductor chips 111a to 111d may be loaded (i.e., disposed) directly onto an insulating layer pattern 130, without upper conducting layer patterns disposed in-between. In this embodiment, electrical connectors can electrically connect any or all of the plurality of lower conducting layer patterns 140a to 140h directly with any or all of the plurality of semiconductor chips 111a to 111d (through the plurality of hole patterns H1 to H7 formed within the insulating layer pattern 130).

That is, this alternative embodiment above can be described in the same manner as the embodiments described with reference to FIGS. 2 to 3C, except this alternative embodiment does not contain any or all of the plurality of upper conducting layer patterns 120*a* to 120*i*, the first bonding wire 170*a*, and the second bonding wire 170*b*.

In more detail, this alternative embodiment of the present invention provides an insulating layer pattern having hole patterns (comprising through holes) and at least one semiconductor chip disposed on the top surface of the insulating layer pattern. Moreover, there is also provided a plurality of lower conducting layer patterns disposed separately from one another on the bottom surface of the insulating layer pattern. Also, electrical connectors electrically connecting the lower conducting layer patterns exposed by the hole patterns and the semiconductor chips are provided. A sealant material sealing the insulating layer pattern, the semiconductor chips, the electrical connectors, and the lower connecting layer patterns may further be included so that only the bottom surface of the lower conducting layer patterns are exposed to the outside. The sealant material may be formed of epoxy molding compound (EMC).

The lower conducting layer patterns may be formed of a conductive material including a metal or an alloy, and may preferably be formed of copper or aluminum. The semiconductor chips may include insulated gate bipolar transistors (IGBTs) and/or diodes. The electrical connectors may include bonding wires, ribbon wires, or metal clips, and may preferably be inclusively formed of aluminum, copper, or gold.

A leadless package according to embodiments of the present invention can result in miniaturization of a package due to the removal of leads. In addition, embodiments of the invention reduce problems with lead bending, and so the package can be stably mounted on an external circuit board.

While the present invention has been particularly shown and described with reference to exemplary embodiments thereof, it will be understood by those of ordinary skill in the art that various changes in form and details may be made therein without departing from the spirit and scope of the present invention as defined by the claims. One or more features from any embodiment may be combined with one or more features of any other embodiment without departing from the scope of the invention.

Spatially relative terms, such as "above", "upper", "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "above" can encompass both an orientation of above and below.

The terms used in the present specification are used in order to describe a specific embodiment, but is not intended to limit the scope of the present invention. As used in the present specification, a singular form may also include a plural form, as long as it is not clearly indicating a different entity within the context. Moreover, "comprise" and/or "comprising" specifies the presence of a mentioned form, number, step, action, element, component, and/or a group thereof, and does not exclude the presence of one or more of other forms, numbers, steps, elements, components, and/or groups thereof.

In the present specification, terms such as "first" or "second" are used in order to describe a variety of elements, parts, regions, layers, and/or portions, but it is apparent that such elements, parts, regions, layers, and/or portions should not be limited to the scope of terms. The terms are used solely for the purpose of distinguishing one element, part, region, layer, or portion from another element, part, region, layer, or portion.

A recitation of "a", "an" or "the" is intended to mean "one or more" unless specifically indicated to the contrary.

What is claimed is:

1. A leadless package comprising:
    a plurality of lower conducting layer patterns disposed separately from one another;
    an insulating layer pattern on the plurality of lower conducting layer patterns;
    a plurality of upper conducting layer patterns disposed separately from one another, wherein the plurality of upper conducting layer patterns is on the insulating layer pattern;
    at least one semiconductor chip disposed on the plurality of upper conducting layer patterns;
    a hole pattern formed in the plurality of upper conducting layer patterns and in the insulating layer pattern, so that a part of the top surface of the plurality of lower conducting layer patterns is exposed;
    a first electrical connector electrically connecting the at least one semiconductor chip and the plurality of upper conducting layer patterns;
    a second electrical connector electrically connecting the plurality of upper conducting layer patterns and the part of the top surface of the lower conducting layer patterns exposed by the hole pattern; and
    a third electrical connector electrically connecting the part of the top surface of the lower conducting layer patterns exposed by the hole pattern with the at least one semiconductor chip,
    wherein the first, second, and third electrical connectors comprise bonding wires.

2. The leadless package of claim 1, further comprising a sealant material sealing the insulating layer pattern, the at least one semiconductor chip, the first, second, and third electrical connectors, the hole pattern, the plurality of upper conducting layer patterns, and the plurality of lower conducting layer patterns, so that the bottom surfaces of the plurality of lower conducting layer patterns are exposed to the outside.

3. The leadless package of claim 1, wherein the plurality of upper conducting layer patterns are formed of a conductive material comprising at least one of a metal or an alloy.

4. The leadless package of claim 3, wherein the conductive material comprises copper.

5. The leadless package of claim 1, wherein the lower conducting layer patterns are formed of a conductive material comprising a metal or an alloy.

6. The leadless package of claim 5, wherein the conductive material comprises aluminum.

7. The leadless package of claim 1, wherein the bonding wires are formed of at least one of aluminum, copper, or gold.

8. A leadless package comprising:
    a plurality of lower conducting layer patterns disposed separately from one another;
    an insulating layer pattern on the plurality of lower conducting layer patterns;
    a plurality of upper conducting layer patterns disposed separately from one another, wherein the plurality of upper conducting layer patterns is on the insulating layer pattern;
    at least one semiconductor chip disposed on the plurality of upper conducting layer patterns;
    a hole pattern formed in the plurality of upper conducting layer patterns and in the insulating layer pattern, so that a part of the top surface of the plurality of lower conducting layer patterns is exposed;

a first electrical connector electrically connecting the at least one semiconductor chip and the plurality of upper conducting layer patterns;

a second electrical connector electrically connecting the plurality of upper conducting layer patterns and the part of the top surface of the lower conducting layer patterns exposed by the hole pattern; and a third electrical connector electrically connecting the part of the top surface of the lower conducting layer patterns exposed by the hole pattern with the at least one semiconductor chip, wherein the first, second, and third electrical connectors comprise ribbon wires or metal clips.

9. The leadless package of claim 1, wherein the at least one semiconductor chip comprises at least one of an insulating gate bipolar transistor or a diode.

10. The leadless package of claim 2, wherein the sealant material is formed of epoxy molding compound.

11. A leadless package comprising: an insulating layer pattern having a hole pattern; a plurality of upper conducting patterns disposed separately from one another, wherein the plurality of upper conducting layer patterns is on the insulating layer pattern; a plurality of semiconductor chips disposed on a top surface of the plurality of upper conducting layer patterns; a plurality of lower conducting layer patterns disposed separately from one another, on the bottom surface of the insulating layer pattern, wherein a part of the top surface of one or more of the plurality of lower conducting layer patterns is exposed by the hole pattern; and at least one bonding wire directly connecting the top surface of the lower conducting layer patterns exposed by the hole pattern and at least one semiconductor chip in the plurality of semiconductor chips.

12. The leadless package of claim 11, further comprising a sealant material sealing the insulating layer pattern, the at least one semiconductor chip, the at least one electrical connector, and the plurality of lower conducting layer patterns, so that the bottom surfaces of the plurality of lower conducting layer patterns are exposed to the outside.

13. The leadless package of claim 11, wherein the plurality of lower conducting layer patterns are formed of a conductive material comprising at least one of a metal or an alloy.

14. The leadless package of claim 13, wherein the conductive material comprises one of copper or aluminum.

15. The leadless package of claim 11, wherein the at least one semiconductor chip comprises at least one of an insulating gate bipolar transistor or a diode.

16. The leadless package of claim 11, wherein the at least one bonding wire is formed of at least one of aluminum, copper, or gold.

17. A leadless package comprising:

an insulating layer pattern having a hole pattern;

a plurality of upper conducting patterns disposed separately from one another, wherein the plurality of upper conducting layer patterns is on the insulating layer pattern;

a plurality of semiconductor chips disposed on a top surface of the plurality of upper conducting layer patterns;

a plurality of lower conducting layer patterns disposed separately from one another, on the bottom surface of the insulating layer pattern, wherein a part of the top surface of one or more of the plurality of lower conducting layer patterns is exposed by the hole pattern; and at least one ribbon wire or metal clip directly connecting the top surface of the lower conducting layer patterns exposed by the hole pattern and at least one semiconductor chip in the plurality of semiconductor chips.

18. The leadless package of claim 12, wherein the sealant material is formed of epoxy molding compound.

* * * * *